United States Patent [19]
Feeney

[11] Patent Number: 5,603,109
[45] Date of Patent: Feb. 11, 1997

US005603109A

[54] AUTOMATIC FREQUENCY CONTROL WHICH MONITORS THE FREQUENCY OF A VOLTAGE CONTROLLED OSCILLATOR IN A PLL DEMODULATOR

[75] Inventor: Stuart M. Feeney, Cupertino, Calif.

[73] Assignee: P-Com, Inc., Santa Clara County, Calif.

[21] Appl. No.: 220,065

[22] Filed: Mar. 29, 1994

[51] Int. Cl.$^6$ ................................................ H04B 1/16
[52] U.S. Cl. ........................... 455/192.2; 455/182.2; 455/197.1; 455/260; 455/264
[58] Field of Search ........................... 455/192.1, 192.2, 455/192.3, 182.2, 182.1, 316, 196.1, 197.1, 257, 258, 260, 264

[56] References Cited

U.S. PATENT DOCUMENTS

| | | | |
|---|---|---|---|
| 4,367,558 | 1/1983 | Gercekci et al. | 455/182.2 X |
| 4,479,256 | 10/1984 | Sewerinson | 455/260 X |
| 5,263,195 | 11/1993 | Panther et al. | 455/192.2 X |
| 5,390,348 | 2/1995 | Magin et al. | 455/192.2 X |
| 5,416,805 | 5/1995 | Tonello et al. | 455/192.2 |

*Primary Examiner*—Reinhard J. Eisenzopf
*Assistant Examiner*—Philip J. Sobutka
*Attorney, Agent, or Firm*—Skjerven, Morrill, MacPherson Franlin & Friel; Alan H. MacPherson; David T. Millers

[57] ABSTRACT

An automatic frequency control circuit measures the deviation in frequency of a selected signal from a reference frequency and when the deviation exceeds a selected threshold which is variable, steps the frequency of the selected signal back to the proper frequency. The selected signal is typically an intermediate frequency (IF) signal in a radio receiver. For detection of frequency deviation, an exclusive OR (EX-OR) circuit receives a reference signal having a frequency proportional to a desired IF carrier frequency and an input signal having a frequency proportional to an actual IF frequency. A divider coupled to a voltage controlled oscillator (VCO) used in demodulation of the IF signal provides the input signal. An output signal of the EX-OR circuit includes a component with a frequency proportional to the difference between the actual and desired IF frequencies. A low pass filter isolates that component, and a charge pump generates a control voltage proportional to the frequency of that component. A comparison of the control voltage and the threshold determines whether the actual IF frequency should be changed.

9 Claims, 3 Drawing Sheets

AUTOMATIC FREQUENCY CONTROL WHICH MONITORS THE FREQUENCY OF A VOLTAGE CONTROLLED OSCILLATOR IN A PLL DEMODULATOR

FIELD OF THE INVENTION

This invention relates to automatic frequency control for microwave radios.

BACKGROUND OF THE INVENTION

Millimetric radios at 23, 38, 50, 55 GHz can have permissible frequency drifts of ±400 to ±800 KHz at each terminal. Therefore the error in the receiver IF signal may be up to ±1.6 MHz.

The optimum IF filter bandwidths are in the range of 3 MHz for low data rates (1 or 2×2 megabits). Hence without frequency correction, the filter bandwidth would have to be widened out to ≈6 MHz. This would impact the receiver noise bandwidth and therefore system sensitivity.

SUMMARY OF THE INVENTION

In accordance with this invention, an automatic frequency control circuit is provided to sense the IF frequency and adjust the tuning of the receiver down converter oscillator to assure an actual IF close to the optimum IF independent of drift in the radio synthesizers. To operate correctly, the AFC circuit must be able to acquire the received signal even when the received signal is off frequency by ±2 MHz and not give error at low carrier-to-noise ratios (i.e. C/N values). Although the demodulator output is not usable for data or video recovery, the average frequency of the demodulator VCO is capable of providing information which may be processed by the AFC circuit to provide frequency correction. Also the circuit should not affect the modulation. This precludes the use of conventional discriminators.

In this invention, the receiver uses a phase locked loop (PLL) as the demodulator where the control voltage on the VCO is used to provide video/data demodulation. This control voltage is not suitable for drift detection due to practical circuit issues such as cost and alignment.

However, the demodulator PLL will track carrier frequencies at very low C/N values ≈5 dB or less which are usable for AFC function, but not recovery of data.

The VCO output is usable as an indicator of the input frequency and this allows AFC detection to be implemented in accordance with this invention. The detector uses a commercial PLL chip in a novel way. Note the AFC circuit is not however phase locked.

DETAILED DESCRIPTION

Figure 1:
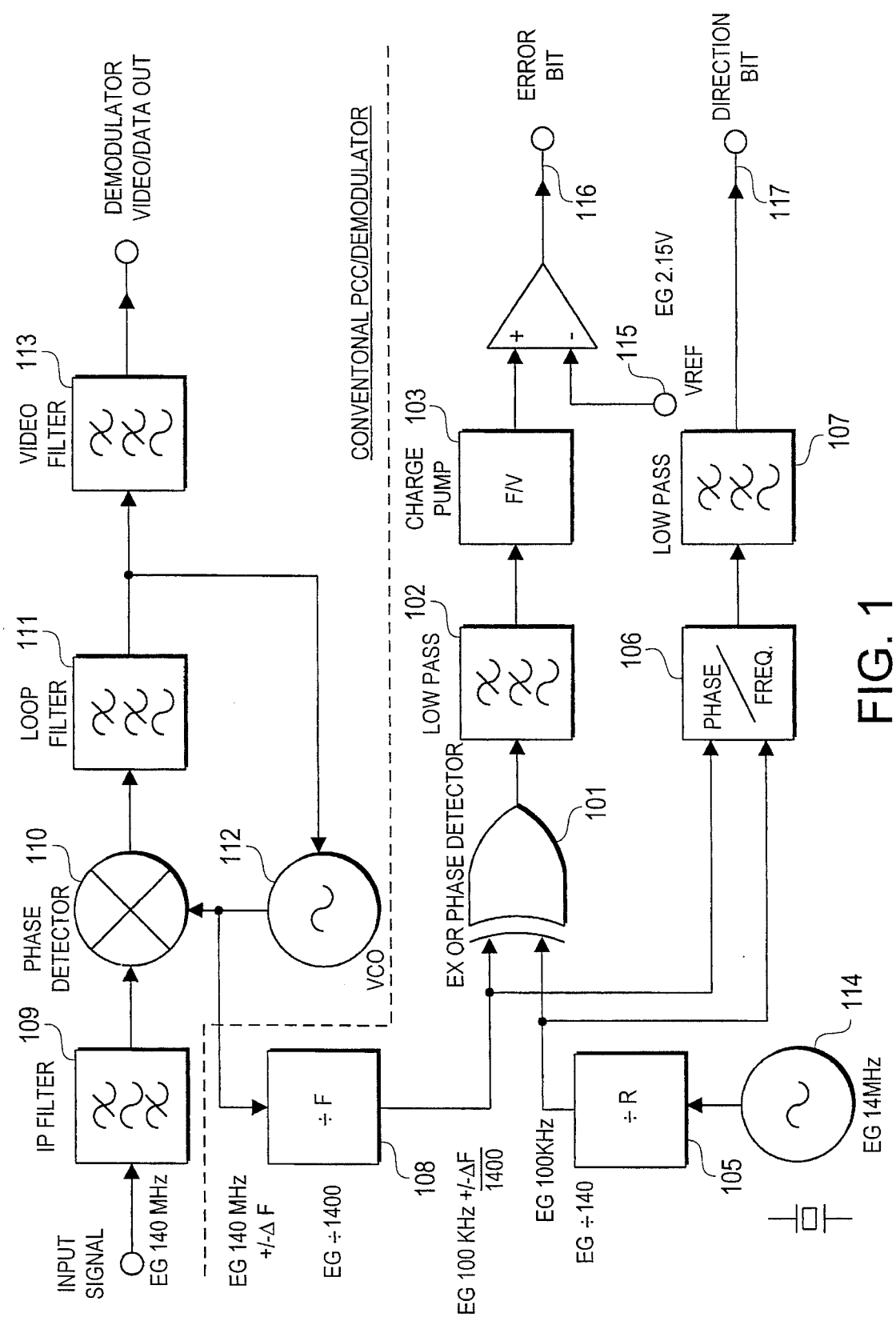
FIG. 1 illustrates one embodiment of a circuit in accordance with this invention.

The circuit contains (amongst other items) an exclusive OR phase detector and a phase frequency detector.

The EX-OR phase detector 101 is used as a frequency differencing mixer, i.e. the output consists of frequency components at the sum and difference of the input signals. The sum is discounted by a low pass filter 102. This gives an output at the difference frequency which can be converted into an analog voltage using a charge pump 103. A trip level can be configured using a comparator 104. The circuit operation is symmetric about a nominal input frequency, i.e. detection at ±Δf about fo where Δf can be manipulated by the choice of threshold, charge pump time constants and frequency division values. The reference frequency (fref) is derived from a quartz crystal in a well known manner.

The direction of error in the frequency of the input signal to IF filter 109 is determined using a phase/frequency 106.

Figure 3:
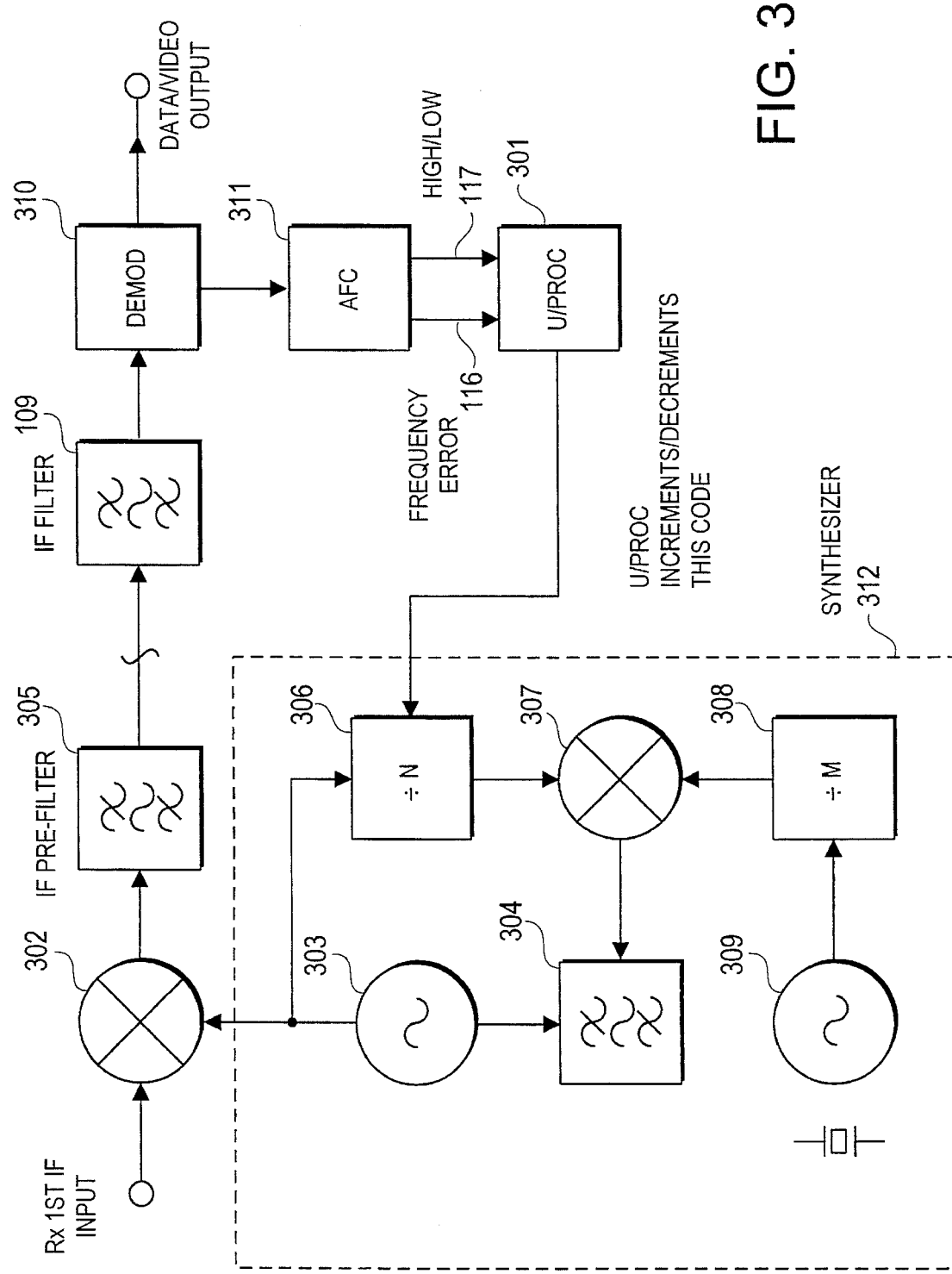
FIG. 3 illustrates the use of the AFC circuit shown in FIG. 1 in a system.

The circuit provides two bits of information to a microprocessor (not shown in FIG. 1 but shown as microprocessor 301 in FIG. 3). Contingent on these values, microprocessor 301 modifies a program word to a synthesizer 312 to step the mix down oscillator 303 such that the IF signal from mixer 302 is stepped back into frequency, The synthesizer 312 is configured so that when the program value input to divider 306 is stepped it slews at a defined rate such that the demodulator operation is not disturbed thus preventing significant error in data or distortion in video.

The system time constants may be made arbitrarily large such that the corrections to frequency are outside the bandwidth of modulation.

One system uses an error trip Δf of ±120 KHz with a synthesizer 312 step size Δf of 200 KHz and an update rate of two samples per minute. This allows a reduction in IF filter bandwidth from ±3 MHz to ±1.6 MHz which saves 2.7 dB on the receiver sensitivity.

Assume a 140 MHz input signal to frequency divider 108. Note this divider also reduces the phase deviation present at the AFC circuit such that the phase/frequency detector operates within the range of the frequency error detection circuit. The input signal is divided by 1400 to give an output of 100 KHz for comparison. Our frequency error is thus divided by 1400 also. Hence an error of 120 KHz becomes $$\frac{120E3}{1400} \simeq 86 \text{ Hz}$$

If a charge pump 103 has a transfer function of 5 V/200 Hz then a threshold voltage Vref for comparator 104 is at $$5 \times \frac{86}{200} = 2.15 \text{ V}$$

Figure 2:
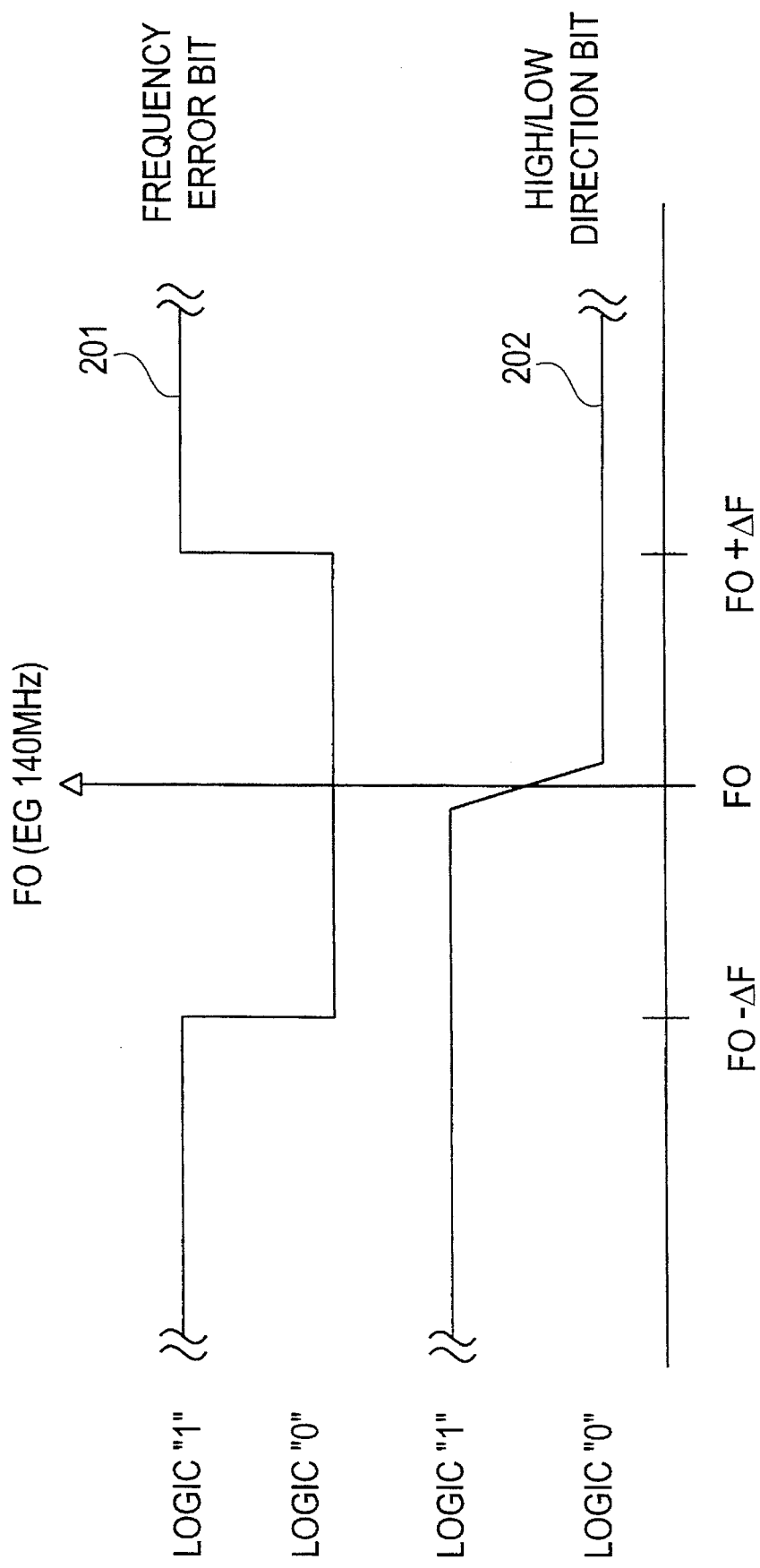
FIG. 2 illustrates the logical output signals from the circuit of FIG. 1 in accordance with this invention.

In accordance with this invention, an input signal such as for example 140 MHz, is passed through bandpass filter 109 to phase detector 110. The other input signal to phase detector 110 comes from VCO 112. The voltage controlling the frequency of VCO 112 is derived from the output signal from loop filter 111, the input signal to which is the output from phase detector 110. The output signal from loop filter 111 is also passed through video filter 113 to become the output signal from the circuit. In accordance with this invention, the output signal from VCO 112 is also passed into divider 108. Divider 108, in one embodiment divides the frequency of this input signal by 1400. The output signal from divider 108 is passed to an input lead of exclusive OR gate 101. The other input signal to exclusive OR gate 101 is derived from divide circuit 105 which divides an input signal from reference oscillator 114 (typically controlled by a crystal) by a selected amount, typically 140. The output signal from divide circuit 105 is the other input to exclusive OR gate 101. This signal is also provided to phase/frequency detector 106, the other input of which is the output signal from divide circuit 108. The output signal from exclusive OR gate 101, which functions as a frequency mixer, is passed through lowpass filter 102 and then to charge pump 103. Charge pump 103 produces an output voltage in response to the signal from lowpass filter 102. The output voltage from charge pump 103 is provided to the positive input lead of comparator 104. The negative input lead has the signal VREF derived from reference source 115. The output signal from comparator 104 becomes positive when a sufficient frequency difference exists between the output signals from divider 108 and divider 105 to provide a sufficiently high frequency output signal from lowpass filter 102 to allow charge pump 103 to produce an output signal in excess of VREF. When this occurs, an error bit, which depend on IF frequency as shown in curve 201 in FIG. 2, is produced which is then transmitted, as shown in FIG. 3, to the microprocessor 301. Microprocessor 301 then produces an output signal which is transmitted to divider 306 to step synthesizer 312 to a new frequency which differs from the former frequency by the amount δf.

Turning back to FIG. 1, the output signals from dividers 108 and 105 are also provided to phase frequency detector 106. The output signal from phase frequency detector 106 is passed through lowpass filter 107 and then transmitted as an output signal on lead 117. This output signal represents a high/low bit that is related to the IF frequency as shown in FIG. 2 as curve 202. This high/low bit is transmitted also to microprocessor 301 and is used by microprocessor 301 to determine the direction of the stepping of synthesizer 312. Thus if the frequency is high, microprocessor instructs synthesizer 312 to lower the output frequency from synthesizer 312 by the amount δf. If the direction bit is low, microprocessor 301 instructs the synthesizer 312 to increase the output frequency from synthesizer 312 by the amount δf.

An automatic frequency control circuit is provided which allows the threshold of the frequency deviation of which corrections will be initiated to be adjusted, operates on signals with low signal to noise ratios, involves simple circuit processing and is configured to operate without significant distortion to the signals being demodulated.

While one embodiment of this invention has been described, other embodiments will be obvious in view of this disclosure.

What is claimed is:

1. An automatic frequency control circuit comprising:

a source of a reference signal having a constant frequency;

an EX-OR gate coupled to receive the reference signal and an input signal, the input signal having a frequency that is proportional to a frequency to be controlled; and a control circuit which analyzes an output signal from the EX-OR gate and changes the frequency to be controlled according to the analysis, wherein the control circuit comprises:

a filter coupled to separate a component signal from the output signal of the EX-OR gate, the component signal having a frequency equal to the absolute difference between the frequency of the reference signal and the frequency of the input signal;

a charge pump coupled to the filter, the charge pump generating a voltage that indicates the frequency of the component signal;

a comparator coupled to the charge pump, wherein the comparator generates a first bit which indicates whether the voltage is greater than a threshold; and control logic which in response to the first bit indicating the voltage is greater than the threshold, changes the frequency to be controlled.

2. The automatic frequency control circuit of claim 1, further comprising a detector coupled to compare the reference signal and the input signal and generate a second bit indicating whether the frequency of the input signal is higher than the frequency of the reference signal, wherein in response to the first bit indicating the voltage is higher than the threshold, the control logic changes the frequency to be controlled in a direction depending on the second bit.

3. The automatic frequency control circuit of claim 1, wherein the source of the reference signal comprises a quartz crystal from which the frequency of the reference signal is derived.

4. A receiver comprising:

a synthesizer having a setting which determines a frequency of an IF signal in the receiver;

a demodulator which demodulates the IF signal, the demodulator containing a voltage controlled oscillator in a phase-locked loop, wherein the voltage controlled oscillator generates a VCO signal that is phase-locked to the IF signal; and an AFC circuit coupled to the voltage controlled oscillator and the synthesizer,. wherein the AFC circuit compares the VCO signal to a reference signal and controls the setting of the synthesizer according to a difference detected between the VCO signal and the reference signal, wherein the AFC circuit comprises:

an EX-OR circuit having input terminals coupled to receive the reference signal and the VCO signal;

a low pass filter coupled to separate a component signal from an output signal of the EX-OR circuit; and a control circuit which controls the setting of the synthesizer according to the frequency of the component signal.

5. The receiver of claim 4, wherein the AFC circuit further comprises a divider coupled between the voltage controlled oscillator and the EX-OR circuit.

6. The receiver of claim 4, wherein the control circuit comprises:

a charge pump coupled to the filter, wherein the charge pump generates a voltage that indicates the frequency of the component signal;

a comparator coupled to the charge pump, wherein the comparator generates a first bit which indicates whether the voltage is greater than a threshold; and control logic which in response to the first bit indicating the voltage is greater than the threshold, changes the setting of the synthesizer.

7. The receiver of claim 6, wherein the AFC circuit further comprises a detector coupled to compare the reference signal and the VCO signal and generate a second bit indicating whether the frequency of the VCO signal is higher than the frequency of the reference signal, wherein in response to the first bit indicating the voltage is higher than the threshold, the control logic changes the setting of the synthesizer in a direction depending on the second bit.

8. The receiver of claim 6, wherein the control logic comprises a microprocessor.

9. A method for controlling an intermediate frequency used in a receiver, comprising:

converting a received signal to a first signal having a frequency that depends on a setting in the receiver;

demodulating the first signal using a phase-locked loop demodulator, wherein a voltage controlled oscillator in the phase-locked loop demodulator generates a second signal which is phase-locked to the first signal;

comparing the second signal and a reference signal which has a constant frequency, wherein comparing comprises:

generating a first control signal indicating an absolute difference between the frequency of the second signal and the frequency of the reference signal; and generating a second control signal indicating whether the frequency of the second signal is higher than the frequency of the reference signal; and changing the setting in response to the first control signal indicating the absolute difference is greater than a threshold, wherein changing the setting comprises changing the setting in a direction which depends on the second control signal.

* * * * *